United States Patent [19]

Kaniwa et al.

[11] Patent Number: 4,677,645
[45] Date of Patent: Jun. 30, 1987

[54] AUDIO SIGNAL TRANSMISSION SYSTEM HAVING NOISE REDUCTION MEANS

[75] Inventors: Koji Kaniwa, Katsuta; Yoshizumi Watatani, Fujisawa; Shigeyuki Itoh, Katsuta, all of Japan

[73] Assignee: Hitachi, Ltd., Tokyo, Japan

[21] Appl. No.: 668,892

[22] Filed: Nov. 7, 1984

[30] Foreign Application Priority Data

Nov. 9, 1983 [JP] Japan ................... 58-209079

[51] Int. Cl.$^4$ ................................. H04B 12/02
[52] U.S. Cl. .......................... 375/8; 333/14; 375/25; 375/34; 455/72; 381/106
[58] Field of Search ............ 375/25, 26, 34, 7, 8; 455/72, 84; 333/14; 381/106; 370/7; 340/347 C; 360/32, 65; 358/335, 339

[56] References Cited

U.S. PATENT DOCUMENTS

| | | | |
|---|---|---|---|
| 2,390,641 | 11/1945 | Chatterjea et al. | 455/84 |
| 3,806,655 | 4/1974 | Hekimian et al. | 370/69.1 |
| 4,030,129 | 6/1977 | Whitlock | 360/32 |
| 4,271,499 | 6/1981 | Leveque | 370/7 |
| 4,381,525 | 4/1983 | Senoo et al. | 360/32 |
| 4,404,602 | 9/1983 | Hoshimi et al. | 360/32 |
| 4,493,091 | 1/1985 | Gundry | 381/106 |

Primary Examiner—Benedict V. Safourek
Attorney, Agent, or Firm—Antonelli, Terry & Wands

[57] ABSTRACT

An audio signal transmission system having a noise reduction circuit, which includes a transmission medium such as a magnetic tape to be used to transmit a digital signal converted from an input audio signal and thereafter to output the audio signal reproduced from the digital signal, a digital signal transmitter having a pulse-code modulator and demodulator (MODEM). The noise reduction circuit includes a compressor for compressing the dynamic range of the input audio signal according to the detection level obtained by detecting at least the high-frequency components thereof in order to supply the output from the compression to the digital signal transmitter and an expander for expanding the dynamic range of the demodulated signal from the transmitter according to the detection level of at least the high-frequency components thereof. The transmission system has a low-pass fitler which limits the frequency band of the input signal to be supplied to the dynamic-range compressor to at most half the sampling frequency of the MODEM and thus permits the noise reduction circuit to compress and expand signals supplied thereto in the same frequency band without causing any erroneous operation.

8 Claims, 11 Drawing Figures

AUDIO SIGNAL TRANSMISSION SYSTEM HAVING NOISE REDUCTION MEANS

BACKGROUND OF THE INVENTION

The present invention relates to an audio signal transmission system having a noise reduction means and a digital signal processor, and in particular, to an audio signal transmission system suitable for reproducing signals with reduced noise and low distortion.

As a method for transmitting signals, a pulse code modulation (PCM) system has been commonly utilized in which the signals to be transmitted are digitalized and undergo pulse code modulation. The PCM system is applicable to various fields because it has such characteristics that a signal can be restored even when the waveform is distorted or any noise is added thereto during the transmission process for transmitting the signal so long as the "0's" and "1's" in the signal can be identified, and that time-base compression and expansion can be effected on the signals without difficulty.

Figure 1:
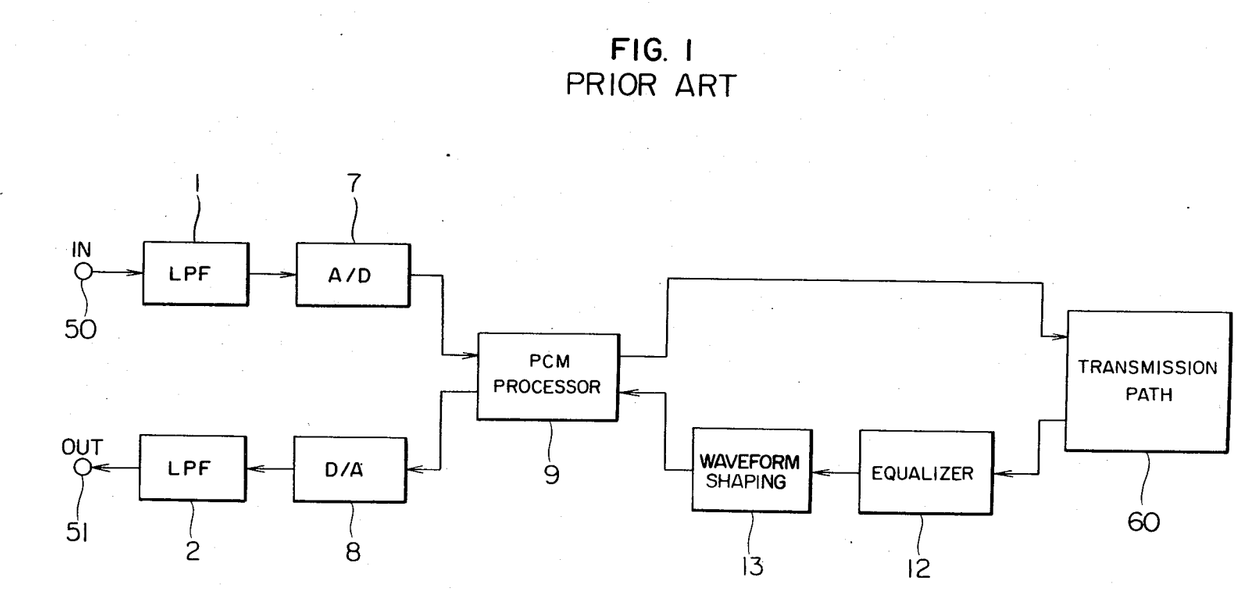
FIG. 1 is a schematic block diagram of a device for magnetically recording and reproducing audio signals in accordance with the PCM system.

FIG. 1 shows a schematic block diagram depicting the construction of a prior art tranmission system in which pulse code modulation is carried out on the audio signals. Referring to FIG. 1, an audio signal received at an input terminal 50 is passed through a low-pass filter (LPF) 1 which filters out the component of the audio signal whose frequency exceeds half the sampling frequency of an analog-to-digital (A/D) converter 7, and the resultant signal is delivered to the A/D converter 7. This frequency band suppression is performed to prevent a folded noise which may be caused by the component of the audio signal whose frequency is greater than half the sampling signal and is indispensable for a transmitter operating in accordance with the PCM system.

The A/D converter 7 converts the audio signal inputted thereto into a digital signal, which is then applied to a PCM processor 9. In the PCM processor 9, the received digital audio signal is modulated to obtain a PCM signal and time-base compression is effected on the PCM signal, then the error detection/correction codes and sync codes are added thereto and the obtained signal is delivered to a transmission path 60, such as a recording medium.

The PCM audio signal reproduced from the transmission path 60 is fed to a waveform equalizer circuit 12 to remove the interference between signals, then the resultant signal is fed to a data strobe circuit 13. The jitter contained in the reproduced signal due to certain causes, such as fluctuation in the transmission path 60, is removed by the data strobe circuit 13, thereby shaping the waveform to obtain a shaped signal. The PCM audio signal subjected to the waveform shaping is delivered to the PCM processor 9, which then performs thereon the error correction and error concealment, pulse code demodulation, and time-base expansion and transfers the obtained signal to a digital-to-analog (D/A) converter 8. The D/A converter 8 converts the received digital audio signal into an analog audio signal, which is then outputted to a low-pass filter (LPF) 2. Unnecessary high-frequency components, such as those caused by the sampling operation in the A/D converter 7, are removed by the low-pass filter 2 so as to reproduce the original audio signal. The reproduced audio signal is supplied from an output terminal 51 to an audio playback system.

In a transmitter which performs the PCM processing on audio signals as described above, however, a high-quality audio signal cannot be easily attained because noise called quantizing noise inherent to a digital system appears if the number of bits assigned to a sample value of the audio signal in the A/D converter is only around eight. To overcome this difficulty, approximately 14 to 16 bits are required for a sample value, which leads to a drawback that a broad band is necessary for the PCM signal transmission.

A method for solving this problem and for obtaining a high-quality audio signal while assigning only about eight bits to each sample value has been proposed in the Japanese Patent Laid-Open No. 57-129549 laid open on Aug. 11, 1982 in which an analog-signal noise reduction (NR) means is provided in a PCM transmission system as described above. The analog-signal noise reduction means equivalently reduces the quantizing noise taking place in a digital processing system by compressing the dynamic range of the input signal by the use of an amplitude compressor at signal transmission (modulation) and by expanding the dynamic range of the reproduced signal by use of an amplitude expander at signal reproduction (demodulation).

Although the proposal described in the Japanese Patent Laid-Open No. 57-129549 relates to a combination of noise reduction means in the analog and PCM signal transmission systems, it does not touch upon the problem associated with the operating frequency band of the noise reduction means and the transmission band of the PCM signal transmission system.

Figure 2:
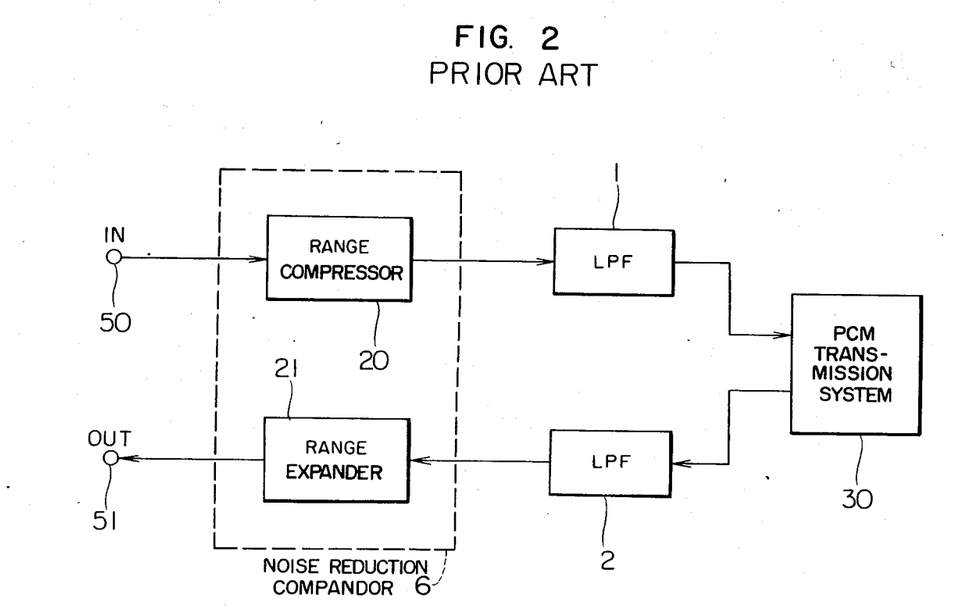
FIG. 2 is a block diagram of the system in which the noise reduction means is combined with the pulse code modem.

FIG. 2 illustrates a circuit block diagram of a system comprising the noise reduction means and a transmitter operating in accordance with the PCM system.

Referring to FIG. 2, the audio signal received at the input terminal 50 fed to a compressor 20 which compresses the dynamic range of the input signal, then the obtained signal is passed through the low-pass filter 1 which passes the input signal whose frequency does not exceed half the sampling signal of the PCM transmitter described above and is delivered to the PCM transmission system 30, which corresponds to the system illustrated in FIG. 1. In the playback, on the other hand, a signal delivered from the PCM transmission system 30 is fed to an expander 21 for expanding the dynamic range of the signal through a low-pass filter 2 having the same pass-band as the low-pass filter 1 to restore the original passband, then the resultant signal is fed from the output terminal 51. In FIG. 2, the blocks enclosed within the broken lines represents a noise reduction compander b comprising the range compressor 20 and range expander 21.

However, in a system in which the noise reduction compander and pulse-code modulation-demodulator (modem) are simply combined as depicted in FIG. 2, the distortion rate of the reproduced signal may be considerably deteriorated because the range expander 21 in the noise reduction compander possibly performs incorrect expansion in some cases.

The erroneous operation of the noise reduction means will be described in detail by referring to FIG. 3 to FIG. 5.

Figure 3A:
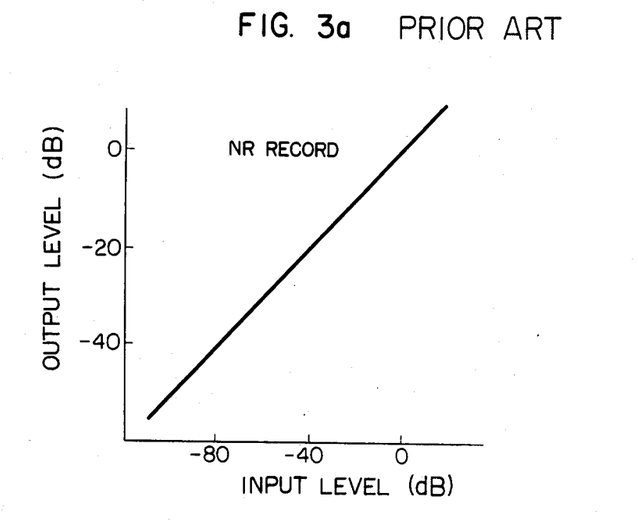
FIGS. 3a and 3b are diagrams of the input/output characteristic of the noise reduction means for the recording and playback operations.
Figure 3B:
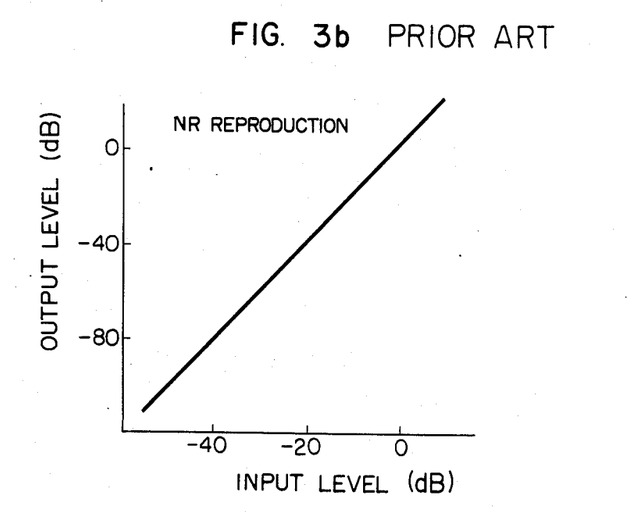

FIG. 3a depicts an example of the input/output amplitude characteristic developed by the compressor 20 which operates by detecting the amplitude of the input signal in the full band range, while FIG. 3b illustrates an example of the input/output characteristic of the expander 21 operating in the same manner as the compressor 20. The graph of FIG. 3 represents the relationship between the input and output levels developed by the compression represented by the following expression;

$$\text{Output level (dB)} = \frac{\text{Input level (dB)}}{2} \quad (1)$$

where the reference level of the input signal is assumed to be 0 decibel. The characteristic of FIG. 3b is obtained by executing the following expansion assuming that the reference level of the input signal is 0 decibel:

$$\text{Output level (dB)} = 2 \times \text{Input level (db)} \quad (2)$$

As an example, consequently, if noise whose magnitude is $-40$ dB occurs on a playback signal which has undergone a $\frac{1}{2}$ compression having the characteristic described above through the signal transmission, the magnitude of the noise can be reduced to $-80$ dB in accordance with the expansion characteristic of the noise reduction means 6.

However, if the band of the input signal at compression differs from that of the input signal at expansion, an erroneous operation in which signal compression and expansion are not consistent with each other takes place in the compressor/expander circuit because of the different detecting wave bands for the compressor and expander, thereby deteriorating the quality of the playback sound.

Figure 4A:
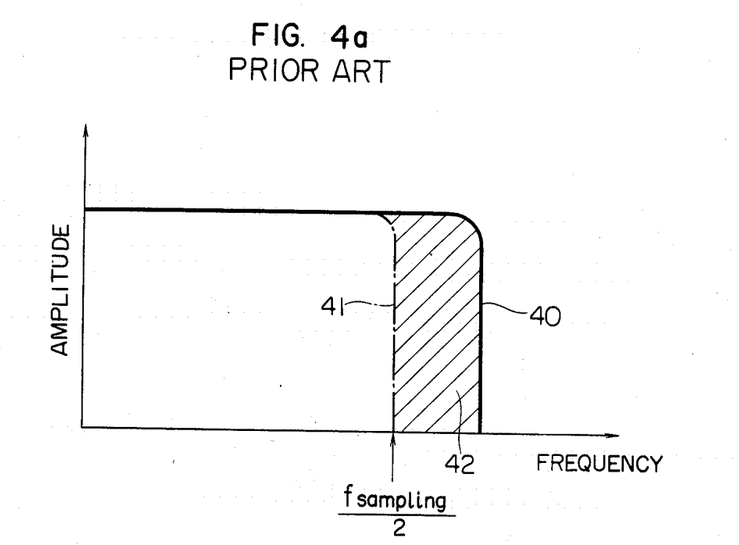
FIGS. 4a, 4b, and 5 are diagrams illustrating for explaining erroneous operations of the noise reduction means.
Figure 4B:
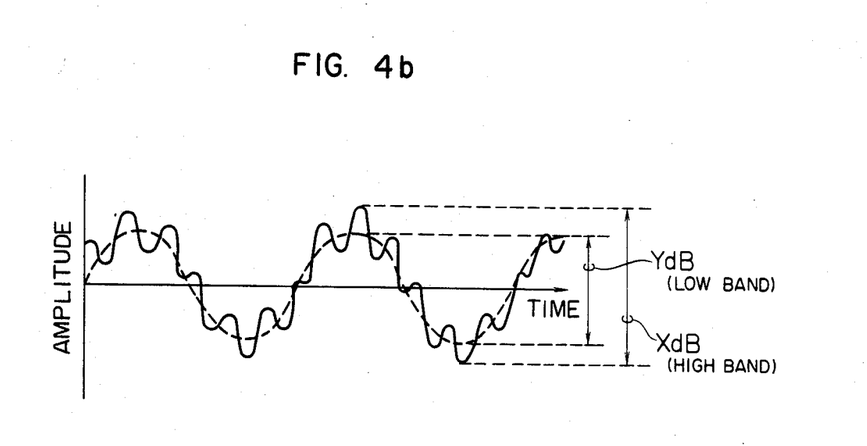

In the system comprising the combination of the noise reduction means and PCM transmission system, therefore, if the input signal to the compressor 20 has a band corresponding to the characteristic curve 40 depicted in FIG. 4a and the band of the input signal to the expander 21 is limited as depicted in the characteristic curve 41 of FIG. 4b because it is determined by the transmission band not exceeding half the sampling frequency of the PCM transmission system, the frequency components of the input signal received for the compression and which are indicated by a hatched area 42 in FIG. 4a are missing in the input signal received for the expansion, thereby making it impossible to recreate the original signal correctly. Assume that the input signal to the compressor 20 comprises the two frequency components shown in FIG. 4b in which the high-frequency component has a frequency exceeding half the sampling frequency and the input level thereof is X (dB) with respect to the reference input level 0 dB. The input level of the low-frequency component of the input signal is Y (dB) with respect to the reference input level 0 dB, where Y is less than X. The input signal, in this case, is compressed by the compressor 20 so that the input level X (dB) becomes to be X/2 (dB) before it is transmitted. That is, the gain G (dB) developed through this compression is expressed as:

$$G \text{ (dB)} = X/2 \text{ (dB)} - X \text{ (dB)} = -X/2 \text{ (dB)} \quad (3)$$

The compressed signal level Y' (dB) of the low-frequency component is represented as follows:

$$Y' \text{ (dB)} = Y \text{ (dB)} + G \text{ (dB)} = Y \text{ (dB)} - X/2 \text{ (dB)} \quad (4)$$

For the expansion, on the other hand, the high-frequency components exceeding half the sampling frequency are not transmitted through the pulse code modulation/demodulation section, that is, only the signal comprising the low-frequency components is fed to the expander 21. The input signal level of the input signal to the expander 21 is thus expressed to be Y' (dB) by the equation (4) above. The output level $Y_{PB}$ (dB) of the output signal from the expander 21 is consequently derived from the equation (2) as follows:

$$Y_{PB} \text{ (dB)} = 2 \times Y' \text{ (dB)} = 2Y \text{ (dB)} - X \text{ (dB)} \quad (5)$$

As can be clear from this result, an erroneous expansion is caused, that is, the input level Y (dB) for the compression canot be recreated and the quality of the reproduced sound is deteriorated.

An example of the erroneous expansion will be described by referring to FIG. 5. The compression characteristic of the $\frac{1}{2}$ compression by the compressor 20 is represented by the direct line (1) in FIG. 5, while the expansion characteristic ($\times 2$) of the expander 21 is indicated by the line (2).

Figure 5:
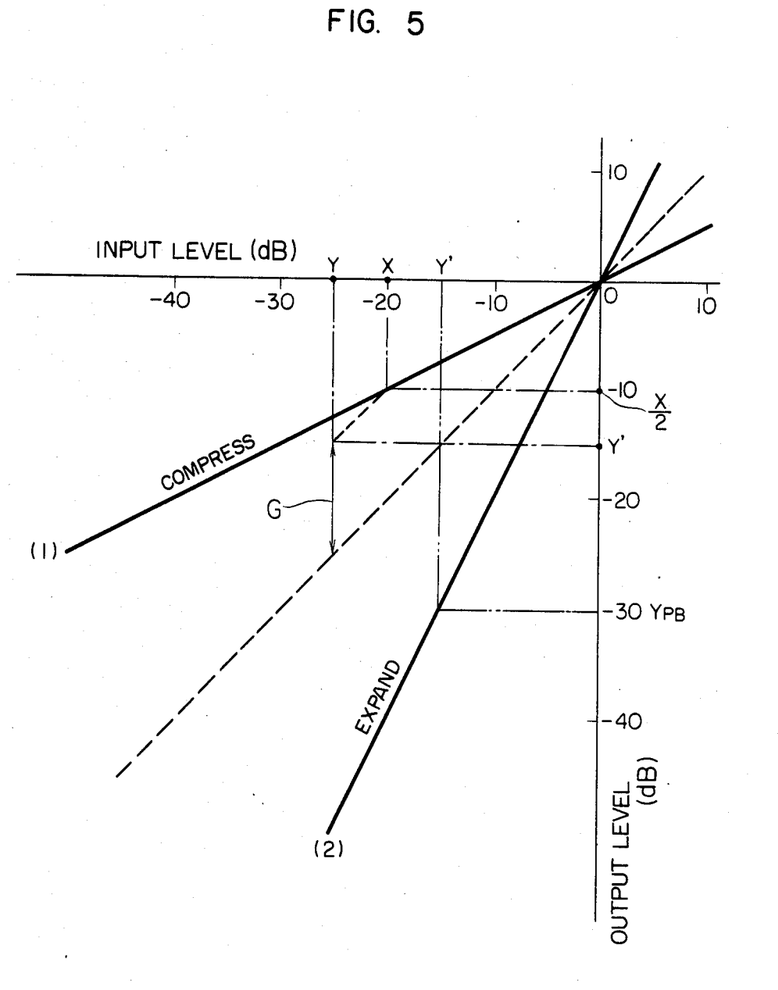

Assume that the input signal level X (dB) (the input level of the signal comprising the above-mentioned two frequency components) of the compressor 20 is $-20$ dB and that the signal level Y (dB) of the low-frequency component is $-25$ dB, then the signal levels after the compression are obtained as illustrated in FIG. 5 based on the equations (1) and (5). Namely, the output level of the signal comprising the two frequency components is $-10$ dB, while the output level Y' (dB) of the low frequency components is $-15$ dB. For the expansion as described above, on the other hand, the signal received by the expander 21 comprises only the low-frequency components, so the signal level of the input signal to the expandor 21 is $-15$ dB. Consequently, the expanded output level $Y_{PB}$ (dB) of the output signal becomes $-30$ dB as depicted in FIG. 5, thus, the output signal level is not equal to the input level which is $-25$ dB of the signal received by the compressor 20.

As described above, the quality of the reproduced sound is remarkably deteriorated by the erroneous expansion particularly when the compression of the compressor 20 and the expansion of the expander 21 are restricted by the amplitude detection signal associated with the full-band components of the input signal or at least the high-frequency components thereof.

SUMMARY OF THE INVENTION

It is therefore an object of the present invention to provide an audio signal transmission system having a compressor and expander circuit for noise reduction and a PCM transmission means, which is free from erroneous operation of the compressor and expander circuit to improve the transmission quality of the audio signal.

Another object of the present invention is to provide an audio signal transmitter suitable for the noise reducing operation in a device for transmitting audio signals including a digital signal transmitting medium for which the transmission band is restricted.

To achieve these objects, the same frequency band must be assigned to the signals fed to the dynamic range compressor and expander included in the noise reduction circuit. In accordance with one feature of the present invention, the audio signal transmitter is configured such that the band of the signal to be transmitted to the dynamic-range compressor of the noise reduction circuit is restricted by use of a low-pass filter having a transmission band for allowing a signal to pass therethrough which is equal to the transmission band of the PCM transmitter (that is, the band pass for the signal having frequencies not exceeding half the sampling frequency) in order to operate the compressor and expander of the noise reduction circuit in the same frequency band, thereby preventing the inconsistent compression and expansion.

With this configuration a relatively small-sized PCM audio signal recording and reproducing system is realized which can record and reproduce a signal of a high-quality sound with low noise and reduced distortion without introducing an error in the noise reduction operation.

BRIEF DESCRIPTION OF THE DRAWINGS

The objects and features of the present invention will become more apparent from the consideration of the following detailed description in conjunction with the accompanying drawings in which.

DETAILED DESCRIPTION OF THE PREFERRED EMBODIMENTS

Figure 6:
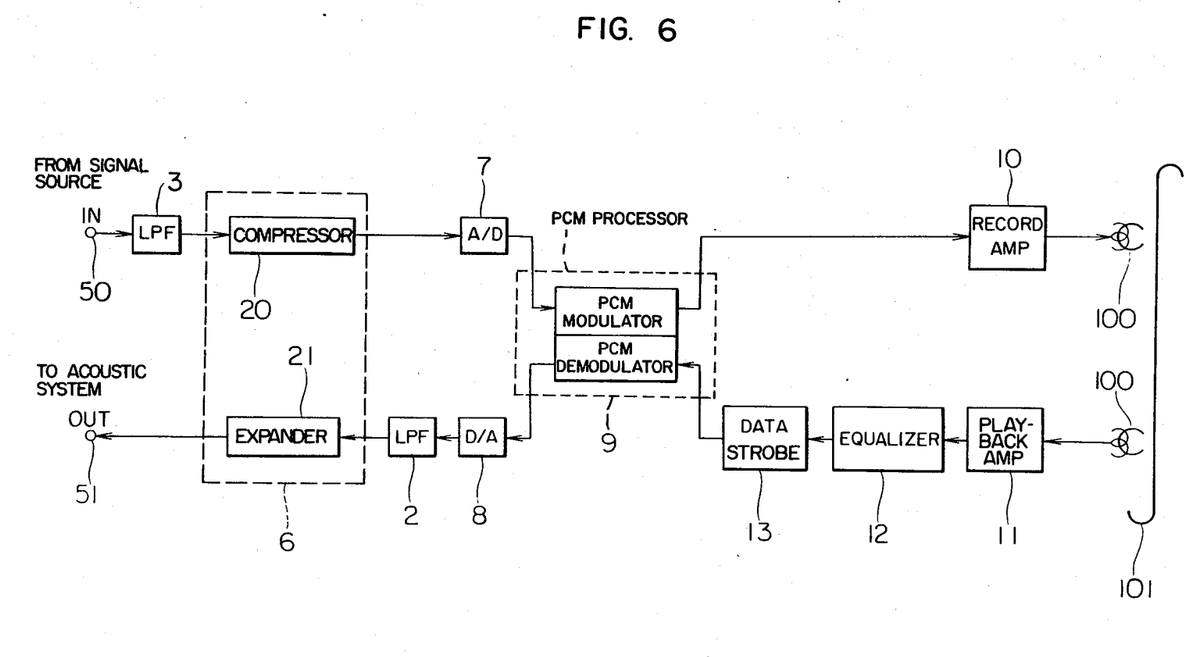
FIG. 6 is a schematic block diagram illustrating an embodiment of the audio signal transmitter in accordance with the present invention.

FIG. 6 is a circuit block diagram showing a circuit configuration of a device for recording and reproducing audio signals by the use of a helical scanning video tape recorder (VTR) in accordance with the present invention. In the figures, the same or equivalent parts are designated by the same reference number.

Referring to FIG. 6, the frequency band of an input signal which is received at the input terminal 50 from an audio signal source (not shown) in a recording operation is restricted by a low-pass filter (LPF) 3 for preventing the erroneous operation of the noise reduction circuit 6 upon the expansion or playback and for suppressing the folded noise from A/D and D/A conversions. The output signal of the LPF 3 is fed to the compressor 20 of the noise reduction circuitry 6. Assume that the sampling frequency is 2 $f_H$ (where $f_H$ is the horizontal synchronizing frequency of the video signal e.g. about 15.7 kHz), then the highest frequency that can be transmitted from the PCM system is $f_H$; hence, the highest frequency of the passing band of the low-pass filter 3 is at most $f_H$. The audio signal received by the compressor 20 is compressed so that the dynamic range thereof is reduced to half the original magnitude in accordance with the compression characteristic illustrated in FIG. 3a, then the compressed signal is sampled by the A/D converter 7 to generate an 8-bit digital signal for each sample value. The generated 8-bit digital signal is then fed to the PCM processor 9, at which the digital audio signal undergoes the same processing pulse-code modulation as describd in conjunction with FIG. 1 and is passed through a recording amplifier 10 to a magnetic head 100, which then records the digital audio signal on a magnetic tape 101.

Figure 9:
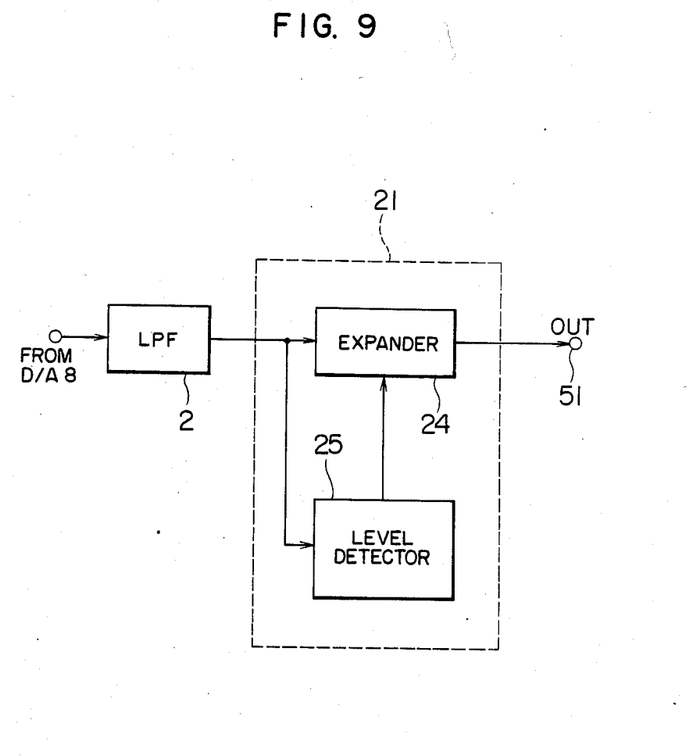
FIG. 9 is a block diagram illustrating an example of an expander used in the present invention.

In the playback operation, on the other hand, a PCM audio signal reproduced from the signal recorded on the magnetic tape 101 by the use of the magnetic head 100 is amplified by a playback amplifier 11, then the picked-up signal undergoes respective signal processings through the waveform equalizer circuit 12, data strobe circuit 13, and PCM processor 9 for pulse-code modulation as described by referring to FIG. 1 and is delivered to the D/A converter 8. The digital audio signal is converted into an analog signal by the D/A converter 8 and is fed to the low-pass filter 2, which eliminates the unnecessary high-frequency components such as those generated during the sampling operation in the D/A converter 8. Then, the D/A converted signal is fed to the expander 21 of the noise reduction circuit 6. The expander 21 may have a circuit configuration as shown by a dotted block 21 in FIG. 9. An expander 24 expands the amplitude of a reproduced signal supplied from the low-pass filter 2 in accordance with a control signal supplied from a level detector 25. The level detector 25 detects the amplitude of an output signal of the low-pass filter 2 to produce the control signal for controlling the volume of expansion by the expander 24. It has been assumed that the low-pass filters 2 and 3 have the same band limitation characteristic. The expander 21 expands the dynamic range of the input audio signal to be twice the compressed signal magnitude in accordance with the expansion characteristics shown in FIG. 3b in order to restore the original audio signal and to attenuate the noise component created during the recording and playback processes, the output signal of the expander 21 is delivered from the output terminal 51 for an acoustic system (not shown).

In the system of this embodiment, the compression (expansion) factor of the noise reduction means 6 is assumed to be ½ in decibel (twice). Then, the dynamic range of the overall system becomes 100 dB in principle if eight bits are assigned to each sample value in the A/D converter 7. This value is obtained as follows. The dynamic range of the signal processing system with respect to the pulse code modulation after the signal compression is expressed by the following equation when the effect of the folded noise is less than that of the quantizing noise:

$$D \text{ (dB)} = 20 \log 2^N + 1.8 \approx 6 \times N + 1.8 \text{ (dB)} \tag{6}$$

Where, D represents the dynamic range and N is the number of bits assigned to each sample value.

Consequently, since N is eight in this embodiment, the dynamic range D is obtained as 50 dB. The dynamic range is substantially multiplied by two because the compression factor at the signal recording operation is ½ and the expansion factor in the signal expansion is two in the noise reduction circuit 6, that is, the system dynamic range is obtained as 50 dB×2=100 dB.

In accordance with the embodiment described hereabove, a high-performance system can be constructed in a small-sized circuit configuration which develops a dynamic range of 100 dB without causing any erroneous operation in the noise reduction circuit and in which an 8-bit processing is carried out in the digital signal processing section.

Another embodiment in accordance with the present invention will be described with reference to FIG. 7, in which the low-pass filter 3 of the signal recording section and the low-pass filter 2 of the playback section 2 in the device for recording and reproducing audio signals shown in FIG. 6 are replaced with a single low-pass filter by the use of a switching circuit cooperative with a record/playback mode selection switch in FIG. 7.

Figure 7:
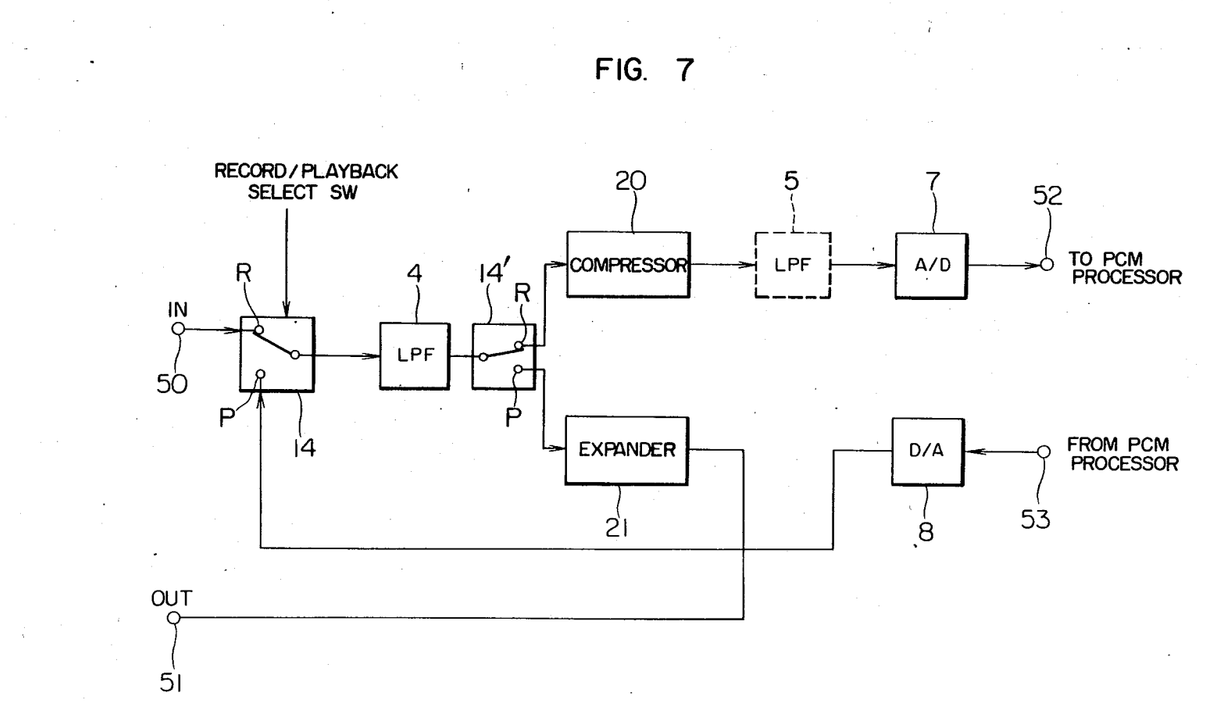
FIG. 7 is a block diagram illustrating another embodiment of the present invention.

Referring to FIG. 7, the audio signal received at the input terminal 50 is applied to a low-pass filter 4 through a switching circuit 14 set to a contact point R. The frequency band of the audio signal is limited to at most half the sampling frequency and the signal from LPF 4 is delivered to the compressor 20 through another switching circuit 14' set to a contact point R, which then compresses the dynamic range of the received signal to one-half the original magnitude and delivers the signal to the A/D converter 7. The audio signal is converted into an 8-bit digital signal and is fed at an output terminal 52 of the A/D converter 7 to the PCM processor 9 described in conjunction with FIG. 6. An additional LPF 5 may be provided between the compressor 20 and the A/D converter 7 to suppress the unnecessary high frequency components generated due to signal compression.

In the signal playback mode, on the other hand, the digital audio signal is fed to the D/A converter 8 through an input terminal 53 connected to the PCM processor 9 of FIG. 6. The digital audio signal is converted into an analog signal by the D/A converter 8 and is passed through the switching circuit 14 set to the contact point P to the low-pass filter 4. The unnecessary high-frequency components such as those created during the sampling operation in the D/A converter are filtered out from the audio signal, and the signal from LPF 4 is delivered to the expander 21 through the switching circuit 14' set to a contact point P, which then expands the dynamic range of the audio signal to be twice the compressed magnitude and delivers the resultant signal from the output terminal 51.

In accordance with the embodiment described above, only one low-pass filter is utilized in the recording and playback sections, that is, exactly the same frequency band can be ensured for the recording and playback operations in the noise reduction compander, thereby preventing the erroneous operation of the noise reduction compander and, a playback sound with high quality can be obtained. Since this system necessitates only one low-pass filter which ordinarily occupies a large space in the circuit, the circuit size can be effectively minimized.

Although a magnetic tape such as an 8 mm video tape is utilized as the signal recording medium and the audio signal transmission band is limited by the frequency band of the digital transmission medium in the system described in the embodiments, the present invention does not depend on the signal recording medium or the characteristic of the transmission path itself, that is, it should be understood that the present invention can be effectively applied to any recording mediums and transmission paths.

It is also clear that the effect of the present invention is not changed even if a low-pass filter is added to this system to process the input signal before the A/D converter and to reject the folded noise caused by the unnecessary high-frequency components emphasized by the compressor of the noise reduction circuit.

Figure 8:
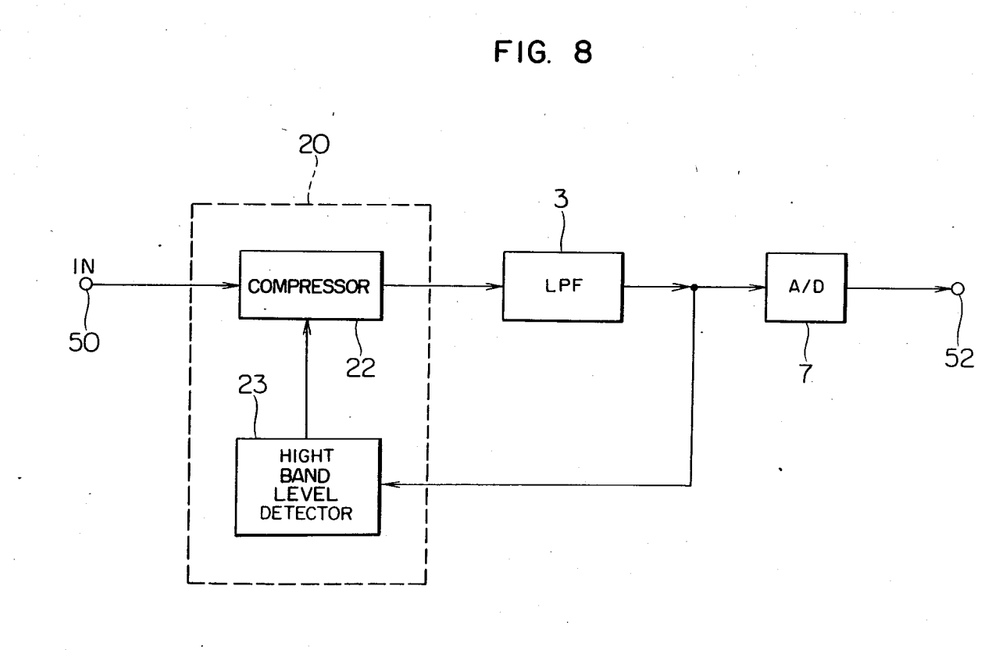
FIG. 8 is a block diagram illustrating a modification of the present invention.

The present invention is not affected even if the audio signal recording section of the recording/playback device of FIG. 6 is configured as illustrated in FIG. 8. The operation of the circuit depicted in FIG. 8 will be described below.

Referring to FIG. 8, an audio signal received at the input terminal 50 is fed to the compressor circuit 22 for compressing the dynamic range of the input signal. The compressor circuit 22 compresses the dynamic range of the received audio signal in accordance with the detection output signal from an amplitude detection circuit 23 which detects at least the high-frequency components of the input signal, then the output signal of the compressor 22 is fed to the low-pass filter 3. The input signal is processed by the low-pass filter 3 which performs the band limiting operation by suppressing the signal components whose frequency exceeds half the sampling frequency of the pulse code modulator. The output signal of the low-pass filter 3 is fed to the amplitude detection circuit 23 and A/D converter 7. Consequently, the dynamic-range compressor 20 comprising the compressor circuit 22 and amplitude detection circuit 23 has an operating frequency band identical to the frequency band of the signal supplied to the amplitude detection circuit 23, that is, the operating frequency band is determined by the band limiting characteristic of the low-pass filter 3. The compressor circuit 22 comprises an amplifier whose gain is controlled by the output level of the detection circuit 23. The audio signal received by the A/D converter is converted into a digital signal, which is delivered from the output terminal 52 to the PCM processor 9 as referred to in FIG. 6.

As described hereabove, the operation band for the dynamic-range compressor 20 to compress the dynamic range is also limited to at most one half the sampling frequency, that is, the signal passing band of the low-pass filter 3 in the circuit configuration of FIG. 8, hence a high-quality audio signal can be reproduced without causing erroneous operation in the dynamic-range expansion process of the playback section.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. An audio signal transmission system for transmitting audio signals, comprising:
    (a) compressor means for compressing the dynamic range of an audio input signal in accordance with an amplitude detection signal obtained by detection of a high-frequency component of said audio input signal;
    (b) expander means for expanding the dynamic range of an output audio signal inputted thereto in accordance with an amplitude detection signal obtained by detection of a high-frequency component of said signal inputted thereto;
    (c) a PCM transmission means including a signal transmitting medium for converting the output of said compressor means into a PCM signal at a predetermined sampling frequency, for transmitting the PCM signal through said medium and for reconverting a PCM signal transmitted through said medium into an output audio signal to be applied to said expander means; and (d) band-limiting means connected to pass a predetermined low frequency band of said audio input signal to said compressor means for limiting the operating frequency band of said compressor means to at most half the sampling frequency of said PCM transmission means.

2. An audio signal transmission signal for transmitting audio signals, comprising:
  (a) compressor means for compressing a dynamic range of an audio input signal in accordance with an amplitude detection signal obtained by detection of a high-frequency component of said input signal;
  (b) expander means for expanding the dyamic range of an output audio signal inputted thereto in accordance with the amplitude detection signal obtained by detection of the high-frequency component of said signal inputted thereto;
  (c) a pulse-code modulator and a pulse code demodulator coupled in a transmission path between said compressor means and said expander means;
  (d) a first low-pass filter having a signal passing band not exceeding half the sampling frequency of said pulse code modulator said compressor means being connected to receive an output signal from said first low-pass filter;
  (e) an anlog-to-digital converter coupled between said signal compressor means and said pulse code modulator;
  (f) a digital-to-analog converter connected to receive an output signal from said pulse code demodulator; and
  (g) a second low-pass filter having a signal passing band not exceeding half said sampling frequency and to which an output signal from said digital-to-analog converter is applied, said expander means being connected to receive an output signal from said second low-pass filter.

3. An audio signal transmission system according to claim 2 in which the signal passing band of said first low-pass filter is equal to that of said second low-pass filter.

4. An audio signal transmission system for transmitting audio signals, comprising:
  (a) compressor means for compressing the dynamic range of an audio input signal in accordance with an amplitude detection signal obtained by detection of a high-frequency component of said input signal;
  (b) expander means for expanding the dynamic range of an audio output signal inputted thereto in accordance with the amplitude detection signal obtained by detection of the high-frequency component of said signal inputted thereto;
  (c) modem means including a pulse-code modulator and a pulse code demodulator;
  (d) a switching circuit having an input terminal to which a first signal is inputted and another input terminal to which a second signal is inputted, said switching circuit outputting one of said two signals by use of the changeover operation thereof;
  (e) a low-pass filter connected to receive an output signal from said switching circuit and which has a signal passing band not exceeding half a sampling frequency of said modem means, an output signal from said low-pass filter being applied to said compressor means or said expander means in response to the operation of said switching circuit;
  (f) an analog-to-digital converter connected to receive an output signal from said compressor means, the pulse code modulator of said modem means being connected to receive an output signal from said analog-to-digital converter and the pulse-code demodulator of said modem means being connected to receive a PCM signal; and
  (g) a digital-to-analog converter connected to receive an output signal from said pulse-code demodulator, said second signal being an output signal from said digital-to-analog converter.

5. An audio signal transmission system according to claim 4 in which said first signal is an audio input signal, an output from said pulse-code modulator is transmitted to a transmission medium, and said pulse-code demodulator receives a PCM signal from said transmission medium.

6. An audio signal transmission system according to claim 5 in which said transmission medium includes a magnetic recording medium.

7. An audio signal transmission system for transmitting audio signals, comprising:
  (a) compressor means for compressing the dynamic range of an audio input signal;
  (b) expander means for expanding the dynamic range of an output audio signal inputted thereto in accordance with an amplitude detection signal obtained by detection of a high-frequency component of said signal inputted thereto;
  (c) PCM transmission means, including a signal transmitting medium, for converting the output of said compressor means into a PCM signal at a predetermined sampling frequency, for transmitting the PCM signal through said medium and for reconverting a PCM signal transmitted through said medium into an output audio signal to be applied to said expander means; and
  (d) band-limiting means connected to pass a predetermined low frequency band of said audio input signal to said compressor means for limiting the operating frequency band of said compressor means to at most half the sampling frequency of said PCM transmission means, further including a low-pass filter connected between said dynamic-range compressor means and said PCM transmission means, and in which said dynamic-range compressor means includes an amplitude detection circuit connected to receive an output signal from said low-pass filter for performing an amplitude detection on a high-frequency component of said output signal and a compressor circuit for compressing the dynamic range of an audio signal inputted in accordance with at least the detection output from said amplitude detection circuit and for supplying an output signal to said low-pass filter.

8. The system of claim 1, further comprising an anti-aliasing low-pass filter coupled between said compressor means and an A-D converter of said PCM transmission means for rejecting folded noise due to sampling of the A-D converter.

* * * * *